United States Patent [19]

Wrzesinski

[11] Patent Number: 5,589,804
[45] Date of Patent: Dec. 31, 1996

[54] OSCILLATOR WITH IMPEDANCE BUFFER FOR INCREASED PULLABILITY

[75] Inventor: Stanley Wrzesinski, Arlington Heights, Ill.

[73] Assignee: Motorola Inc., Schaumburg, Ill.

[21] Appl. No.: 502,998

[22] Filed: Jul. 17, 1995

[51] Int. Cl.⁶ .............................. H03B 5/36; H03C 3/20
[52] U.S. Cl. ................... 331/116 R; 331/36 C; 331/158; 331/177 V; 332/136; 375/303
[58] Field of Search .................... 331/36 C, 116 R, 331/116 FE, 117 R, 117 FE, 117 D, 158, 177 V; 332/135, 136, 139; 375/303

[56] References Cited

U.S. PATENT DOCUMENTS

| | | | |
|---|---|---|---|
| 4,139,826 | 2/1979 | Pradal | 331/116 R |
| 4,560,955 | 12/1985 | Sauer | 331/116 R |
| 4,587,497 | 5/1986 | Keller et al. | 331/116 R |
| 4,591,807 | 5/1986 | Davis | 331/116 R |
| 4,859,969 | 8/1989 | Malinowski et al. | 331/43 |
| 4,999,589 | 3/1991 | DaSilva | 331/117 R |

*Primary Examiner*—David Mis
*Attorney, Agent, or Firm*—Nicholas C. Hopman

[57] ABSTRACT

A pullable overtone crystal oscillator (201) includes an impedance buffer (217) for buffering an input impedance (109) to an amplifier stage (203). This structure enables construction of an overtone oscillator with increased pullability because a drive level of a crystal (221) can be set independent of the input impedance (109) of the amplifier stage (203).

10 Claims, 1 Drawing Sheet

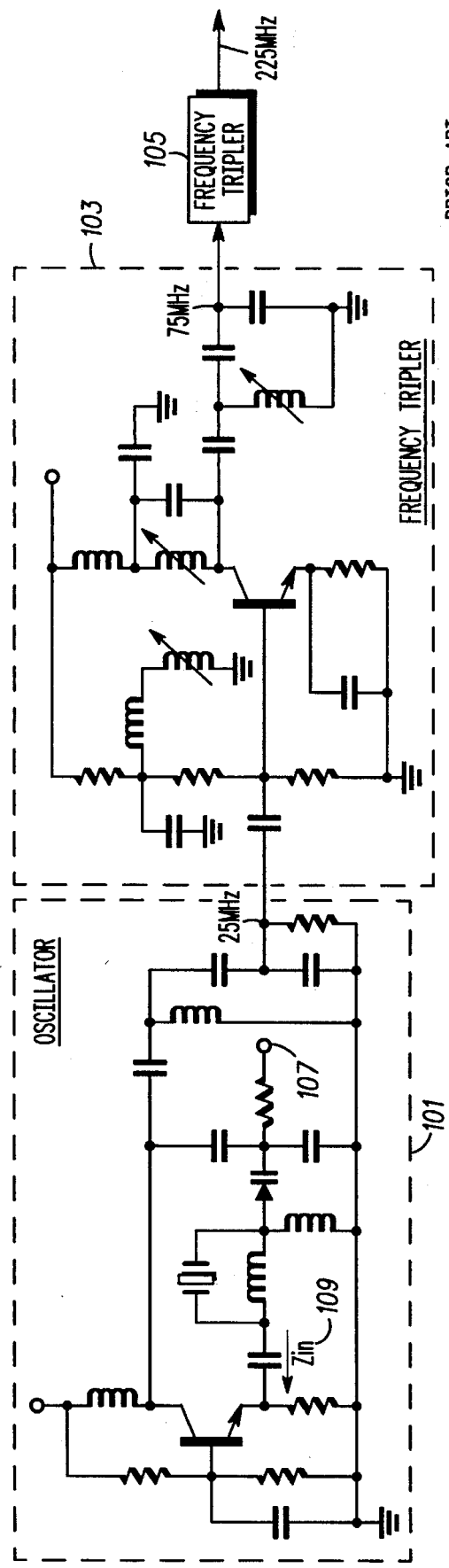
*FIG.1* —PRIOR ART—
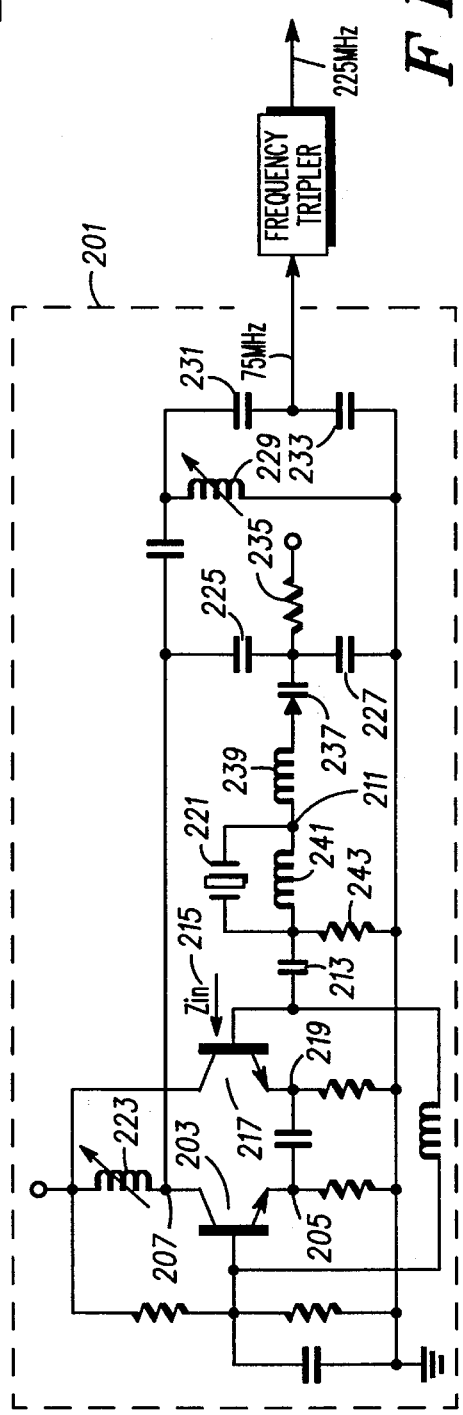
*FIG.2*

OSCILLATOR WITH IMPEDANCE BUFFER FOR INCREASED PULLABILITY

FIELD OF THE INVENTION

This invention is generally directed to the field of crystal oscillators, and specifically for frequency tunable crystal oscillators used in communications systems.

BACKGROUND OF THE INVENTION

In contemporary radio based communications systems, frequency modulation (FM) is often used to communicate information including voice and data wirelessly. Since the communicated information is represented in the form of absolute frequency, it is paramount that the frequency stability of the oscillator is well controlled. Many communications system operate at several hundred MHz. Frequency stability is often difficult to achieve economically at these relatively high operating frequencies. Furthermore, for efficiency reasons, it is also desirable to have a wide span of FM control of the oscillator. A common measure of the span of control is often called "pullability" of the oscillator, and refers to an extent that an oscillator can be modulated. The requirements for frequency stability, high operating frequency, and pullability are often competing. As a result using an oscillator architecture that has good frequency stability often means that it needs to be operated at fundamental mode. Conversely, an oscillator with good pullability generally has relatively poor frequency stability, but may be operable at a high operating frequency.

Often, to achieve acceptable frequency stability, crystal based oscillators are used. One difficulty with a crystal oscillator is that it is difficult at best to construct a frequency stable and pullable oscillator operating at frequencies above about 30 MHz using an A-T cut crystal. To achieve higher operating frequencies, frequency multipliers are often employed to scale the oscillator's frequency upwards. It is not uncommon to stage several frequency multipliers in series to further boost the oscillator's frequency. A problem with this approach is additional complexity because of the additional frequency multiplier stages which leads to higher complexity, difficulty of manufacturing, and lower field reliability, not to mention higher cost.

Another approach is to use an overtone oscillator that oscillates at overtone frequencies rather than at a crystal's fundamental frequency. So, a third overtone 25 MHz fundamental oscillator will operate at 75 MHz. This approach requires less frequency scaling which reduces complexity. However the pullability suffers dramatically as the overtone order increases. As a practical matter the pullability decreases because the crystal's motional capacitance decreases inversely as square of the overtone order. So, for a 3rd order overtone oscillator the motional capacitance decreases by a factor of 9, and for a 5th order overtone the motional capacitance decreases by a factor of 25.

FIG. 1 illustrates a typical prior art pullable crystal oscillator in a Colpitts arrangement 101 operating at 25 MHz with two post frequency multiplier/tripler stages 103, 105 that raise the oscillator's frequency from 25 MHz to 75 MHz, and then to 225 MHz. Pullability is achieved by forcing a modulation signal into the circuit at reference number 107.

This scheme performs acceptably for many applications but suffers from complexity, difficulty of manufacturing, and other factors introduced earlier. As mentioned earlier a 3rd overtone oscillator could be substituted for the oscillator 101 and the first frequency tripler 103 but the system's pullability would suffer significantly.

What is needed is an improved frequency modulable oscillator that is stable, operates at a relatively high frequency and has good pullability using a simpler structure that is more reliable, easier to manufacture, and system implementation that is less costly.

BRIEF DESCRIPTION OF THE DRAWINGS

FIG. 1 is a schematic diagram of a typical prior art pullable overtone oscillator with two frequency triplers; and FIG. 2 is a schematic diagram of a pullable overtone crystal oscillator in accordance with a preferred embodiment of the invention.

DETAILED DESCRIPTION OF A PREFERRED EMBODIMENT

A pullable overtone crystal oscillator includes an impedance buffer for buffering an input impedance to an amplifier stage. This structure enables construction of an overtone oscillator with increased pullability because a drive level of a crystal can be set independent of the input impedance of the amplifier stage. This structure is advantageous because it allows for greater pullability of the oscillator when crystal power is set to an acceptable drive level. The preferred embodiment will be better understood by a review of the accompanying figures.

As stated in the Background section, a problem with overtone oscillators is their poor characteristic to pulling. The pullability of the oscillator is inversely proportional to its order.

FIG. 2 is a schematic diagram of a pullable overtone crystal oscillator 201 in accordance with the preferred embodiment of the invention. It is comprised of two active transistor amplifier stages, transistor 203 being the common-base stage which provides high voltage gain in the circuit, and transistor 217 being an emitter follower stage providing unity gain and impedance transformation of an input or emitter 205 of transistor amplifier 203. The very low ac emitter impedance of the transistor amplifier 203 common base stage is transformed by a few orders of magnitude by the emitter follower stage 217. The input impedance of the emitter follower 217 is high enough to enable independent drive level setting of a crystal 221 by a resistor 243. The resistor 243 value can be set much higher than the input impedance of a single transistor oscillator stage at the emitter which relatively low input impedance was the limitation in prior an designs. Without the emitter follower 217, prior art designs had limited pullability because the crystal's drive level could not be set independent of the relatively low impedance of the common base stage 203. In these designs the crystal had to be driven fairly hard—making it relatively stiff—thus less pullable. In other words in prior art designs, the crystal had to be driven at a drive level that significantly reduced it's pullability in order to make the oscillator function at all. In the present embodiment the drive level of the crystal is set to level where pullability and stability requirements are met simultaneously. This is a significant advantage over the prior art structures.

The common-base stage has an output or collector circuit 207 load configured as an L-C tapped capacitive circuit comprising of the following components 223, 225 and 227. Essentially the capacitors 225 and 227 form a signal divider to feed a resonant circuit described later. Other circuit arrangements for signal dividers are possible including a tapped inductors but capacitors are preferred because of there relatively low cost. This tank circuit 223,225,227 is coupled by C8 to a signal extracting tank circuit 229, 231, and 233. Both coils 223, and 229 of the tanks are adjustable so that optimal signal strength is extracted from the common-base amplifier transistor 203.

A modulation signal for frequency modulating the oscillator dependent on the data to be encoded is fed through a resistor 235 to a varactor diode 237 at an electrical junction of the two capacitors 225 and 227. Two different voltage levels of a incoming square wave data signal modulate the oscillator via the resistor 235 and the varactor diode 237, effectively pulling the oscillator by an amount of frequency. Frequency pulling of ±4 kHz is easily achieved with this topology circuit, satisfying modulation requirements in many narrow band FM applications.

Components 239, 241, and 243 provide a direct current path for the modulation signal injected into the resistor 235 and the varactor diode 237. Inductor 241 is chosen to be self resonant with the crystal's 221 package capacitance, and since its parallel impedance is much higher than the series resonance of the crystal, the target frequency or desired oscillator operating frequency is maintained. The value of inductor 239 is chosen to offset an impedance of the varactor diode at its center point of operation so that no undesirable frequency shifts take place.

The gain of transistor stage 203 must be much greater than an ac voltage division characteristic of the topology of capacitors 225 and 227. If the gain is high enough, and open loop voltage gain is greater than 1 under all operating conditions (modulated or unmodulated), the oscillator will continue to operate properly.

In conclusion a pullable overtone crystal oscillator 201 has been detailed that overcomes some significant deficiencies of prior art pullable oscillators. An impedance buffer 217 presents an input impedance to tuned circuit comprised of components 225, 227, 237, 239, 221, and 241. This buffer structure enables construction of an overtone oscillator with increased pullability because a drive level of a crystal can be set independent of the input impedance of the amplifier stage using resistor 243 without effecting the gain of the amplifier stage 203. This results in a frequency modulable overtone oscillator that is stable, operates at a relatively high frequency and has good pullability using a simpler structure that is more reliable, easier to manufacture, and system implementation that is less costly.

What is claimed is:

1. A pullable overtone oscillator comprising:
    an amplifier having an input and an output wherein the output of the amplifier forms an output of the pullable overtone oscillator;
    a tuned circuit having an input coupled to the output of the amplifier, and an output; and
    an emitter follower having an input coupled to the output of the tuned circuit, and an output coupled to the input of the amplifier.

2. A pullable overtone oscillator in accordance with claim 1 wherein the amplifier is configured as a common-base amplifier.

3. A pullable overtone oscillator in accordance with claim 1 wherein the tuned circuit comprises a crystal.

4. A pullable overtone oscillator according to claim 3, wherein the tuned circuit further comprises a variable reactance element.

5. A pullable overtone oscillator according to claim 4, wherein the variable reactance element is a varactor diode.

6. A pullable overtone oscillator comprising:
    an amplifier having an input and an output wherein the output of the amplifier forms an output of the pullable overtone oscillator;
    an inductive load coupled to the output of the amplifier;
    a signal divider having an input coupled to the output of the amplifier, and an output;
    a crystal circuit having an input coupled to the output of the signal divider, and an output; and
    an emitter follower having an input coupled to the output of the crystal circuit, and an output coupled to the input of the amplifier.

7. A pullable overtone oscillator in accordance with claim 6 wherein the signal divider is comprised of two capacitors and wherein the output is connected at an electrical junction of the two capacitors.

8. A pullable overtone oscillator in accordance with claim 7 wherein the amplifier is configured as a common-base amplifier.

9. A pullable overtone oscillator according to claim 6, wherein the crystal circuit further comprises a varactor diode.

10. A pullable overtone crystal oscillator comprising:
    a transistor amplifier including a base circuit, an emitter circuit, and a collector circuit wherein the collector circuit of the amplifier forms an output of the pullable overtone oscillator;
    an inductive load coupled to the collector circuit of the transistor amplifier;
    a capacitive circuit having an input node coupled to the collector circuit of the transistor amplifier, and an output node at an electrical junction of two capacitors;
    a crystal circuit having an input node coupled to the output node of the capacitive circuit, and an output node;
    an emitter follower having a base circuit coupled to the output node of the crystal circuit, and an emitter circuit coupled to the emitter circuit of the transistor amplifier.

* * * * *